(12) United States Patent
Qi et al.

(10) Patent No.: US 11,702,751 B2
(45) Date of Patent: Jul. 18, 2023

(54) NON-CONFORMAL HIGH SELECTIVITY FILM FOR ETCH CRITICAL DIMENSION CONTROL

(71) Applicant: Applied Materials, Inc., Santa Clara, CA (US)

(72) Inventors: Bo Qi, San Jose, CA (US); Huiyuan Wang, Santa Clara, CA (US); Yingli Rao, Palo Alto, CA (US); Abhijit Basu Mallick, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 257 days.

(21) Appl. No.: 16/989,167

(22) Filed: Aug. 10, 2020

(65) Prior Publication Data

US 2021/0047733 A1    Feb. 18, 2021

Related U.S. Application Data

(60) Provisional application No. 62/887,078, filed on Aug. 15, 2019.

(51) Int. Cl.
| | |
|---|---|
| *C23C 16/30* | (2006.01) |
| *C23C 16/56* | (2006.01) |
| *C23C 16/455* | (2006.01) |
| *H10B 12/00* | (2023.01) |
| *H10B 41/20* | (2023.01) |
| *H10B 41/35* | (2023.01) |

(52) U.S. Cl.
CPC .............. *C23C 16/56* (2013.01); *C23C 16/30* (2013.01); *C23C 16/45529* (2013.01); *H10B 12/02* (2023.02); *H10B 12/30* (2023.02); *H10B 41/20* (2023.02); *H10B 41/35* (2023.02)

(58) Field of Classification Search
CPC ... C23C 16/30; C23C 16/56; C23C 16/45529; H01L 21/0228
See application file for complete search history.

(56) References Cited

U.S. PATENT DOCUMENTS

| | | | |
|---|---|---|---|
| 7,084,046 B2 | 8/2006 | Mitani et al. | |
| 8,592,324 B2 | 11/2013 | Okada et al. | |
| 8,598,040 B2 | 12/2013 | Gouil et al. | |
| 10,886,140 B2* | 1/2021 | Jiang | H01L 21/31144 |
| 2014/0273462 A1* | 9/2014 | Simsek-Ege | H01L 21/31144 |
| | | | 438/696 |
| 2016/0126106 A1 | 5/2016 | Shimizu et al. | |

(Continued)

FOREIGN PATENT DOCUMENTS

KR    100832944 B1    5/2008

OTHER PUBLICATIONS

PCT International Search Report and Written Opinion in PCT/US2020/045699 dated Nov. 23, 2020, 11 pages.

*Primary Examiner* — Elizabeth A Burkhart
(74) *Attorney, Agent, or Firm* — Servilla Whitney LLC

(57) ABSTRACT

A non-conformal, highly selective liner for etch methods in semiconductor devices is described. A method comprises forming a film stack on a substrate; etching the film stack to form an opening; depositing a non-conformal liner in the opening; etching the non-conformal liner from the bottom of the opening; and selectively etching the film stack relative to the non-conformal liner to form a logic or memory hole. The non-conformal liner comprises one or more of boron, carbon, or nitrogen.

20 Claims, 6 Drawing Sheets

(56) References Cited

U.S. PATENT DOCUMENTS

| | | | |
|---|---|---|---|
| 2016/0163557 A1* | 6/2016 | Hudson | H01L 21/31116 156/345.24 |
| 2016/0251755 A1 | 9/2016 | Kitamura et al. | |
| 2017/0170065 A1 | 6/2017 | Kitamura et al. | |
| 2017/0342548 A1 | 11/2017 | Shimizu et al. | |
| 2017/0345644 A1 | 11/2017 | Shimizu et al. | |
| 2020/0035505 A1* | 1/2020 | Jiang | H01L 21/0228 |

* cited by examiner

NON-CONFORMAL HIGH SELECTIVITY FILM FOR ETCH CRITICAL DIMENSION CONTROL

CROSS-REFERENCE TO RELATED APPLICATIONS

This application claims priority to U.S. Provisional Application No. 62/887,078, filed Aug. 15, 2019, the entire disclosure of which is hereby incorporated by reference herein.

TECHNICAL FIELD

Embodiments of the disclosure generally relate to deposition methods for forming a protection layer during etch processes in a semiconductor device. More specifically, embodiments of the disclosure relate to a non-conformal, highly selective liner for etch processes in semiconductor devices.

BACKGROUND

Semiconductor technology has advanced at a rapid pace and device dimensions have shrunk with advancing technology to provide faster processing and storage per unit space. As semiconductor technology advances, the market demands increasing smaller chips with increasingly more structures per unit area. One class of devices which has seen many advances in miniaturization are memory devices.

Two of the mainstays of the memory segment are NAND flash and DRAM. DRAM is dynamic, volatile and very fast, making it well suited for short term system memory. Conversely, NAND flash is non-volatile, which means it has good retention and can function well for long term storage. Higher speed, higher density and lower bit cost have been the main goals for both of these memory types as demand continues to increase.

DRAM has continued the path of scaling to smaller cell designs. This dimension shrink has driven the introduction of multiple patterning technology. Planar NAND was also facing scaling restrictions, and ultimately changed course to move in the vertical direction. This vertical integration has relaxed the lithography requirements for 3D NAND devices, and has instead migrated the most complex process challenges to deposition and etch. As the demand for higher density increases, the typical approach in NAND devices has been to stack more layers. Yet additional layers result in thicker stacks which are increasingly difficult to etch due to increasing aspect ratios.

The primary structure is created by alternating film depositions, then completing a high aspect ratio etch through the entire stack. Each new node in 3D NAND takes the process to an even higher vertical stack. High aspect ratio structures have unique process control requirements since the channels are on the order of microns deep with angstrom-level requirements for precision.

V-NAND, or 3D-NAND, structures are used in flash memory applications. V-NAND devices are vertically stacked NAND structures with a large number of cells arranged in blocks. Prior to word line formation, the substrate is a layered oxide stack. A memory string is formed in a gap or slit that passes vertically through the layered oxide and nitride (ON) stack.

As the number of ON pairs and tiers increases to achieve high capacity, the aspect ratio of a feature, such as memory holes, or slits, increases greatly (>20). As a result, etching of these high aspect ratio structures is becoming increasingly challenging. Often bow critical dimension (CD) and delta critical dimension (CD) is out of design specification. Advancement of etch tool's hardware and process may not be fast enough to address these issues.

Therefore, there is a need in the art for methods of etching that protect the sidewall of a semiconductor device so that the bow critical dimension (CD) is greatly reduced. Current processes either use conformal atomic layer deposition/molecular layer deposition/furnace (ALD/MLD/furnace) processes to deposit carbon/boron/aluminum oxide (C/BN/$Al_2O_3$), or carbon (C) liners, or chemical vapor deposition (CVD) to deposit carbon/tungsten carbide (C/WC) liners.

SUMMARY

One or more embodiments of the disclosure are directed to methods of etching a film stack. The method comprises forming a film stack on a substrate, the film stack comprising a plurality of alternating layers of an oxide material and a nitride material and the film stack having a stack thickness; etching the film stack to a first depth to form an opening with at least one sidewall and a bottom, the first depth being less than the stack thickness; depositing a non-conformal liner on the at least one sidewall and the bottom of the opening, the non-conformal liner on the bottom of the opening having a thickness less than a thickness of the non-conformal liner on the at least one sidewall of the opening; etching the non-conformal liner from the bottom of the opening; selectively etching the film stack relative to the non-conformal liner to a second depth to form a hole; and removing the non-conformal liner.

Additional embodiments of the disclosure are also directed to methods of etching a film stack. A method comprises: forming a film stack on a substrate, the film stack comprising a plurality of alternating layers of an oxide material and a nitride material and the film stack having a stack thickness; forming a patterned hard mask on the film stack; etching the film stack through the hard mask to a first depth to form an opening with at least one sidewall and a bottom surface, the first depth being less than the first thickness; depositing a non-conformal liner by chemical vapor deposition on the at least one sidewall and the bottom surface of the opening, the non-conformal liner on the bottom surface of the opening having a thickness less than a thickness of the non-conformal liner on the at least one sidewall of the opening, the non-conformal liner comprising one or more of boron, nitrogen, or carbon; etching the non-conformal liner from the bottom surface of the opening; selectively etching the film stack relative to the non-conformal liner to a second depth to form a hole; and performing an anneal of the substrate to remove the non-conformal liner.

Further embodiments of the disclosure are directed to an electronic device. An electronic device comprises: a film stack on a substrate, the film stack comprising a plurality of alternating layers of an oxide material and a nitride material and the film stack having a stack thickness; a patterned hard mask on the film stack; an opening of a first depth formed in the film stack, the opening having at least one sidewall and a bottom, the first depth being less than the first thickness; and a non-conformal liner formed on the at least one one sidewall and the bottom surface of the opening, the non-conformal liner comprising one or more of boron, nitrogen, or carbon.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
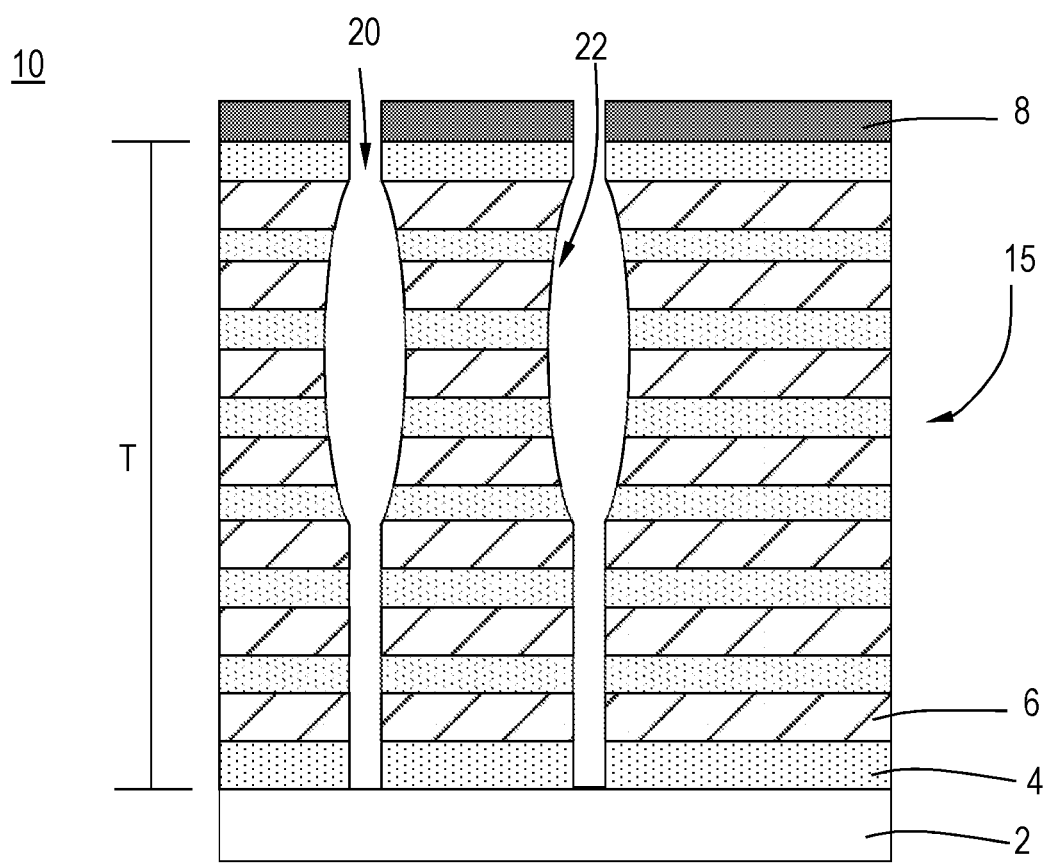
FIG. 1 illustrates an exemplary electronic device according to the prior art.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "about" as used herein means approximately or nearly and in the context of a numerical value or range set forth means a variation of ±15%, or less, of the numerical value. For example, a value differing by ±14%, ±10%, ±5%, ±2%, or ±1%, would satisfy the definition of about.

As used in this specification and the appended claims, the terms "substrate" or "wafer" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what materials are to be deposited, as well as the particular chemistry used.

As used in this specification and the appended claims, the terms "precursor", "reactant", "reactive gas" and the like are used interchangeably to refer to any gaseous species that can react with the substrate surface.

Dynamic random-access memory (DRAM) is a type of random access semiconductor memory that stores each bit of data in a separate tiny capacitor within an integrated circuit. NAND and V-NAND devices are both types of flash memory, which is a class of non-volatile memory that retains data even in the absence of an electrical current. Flash memory is very portable and combined with its other characteristics of durability and speed. V-NAND devices are vertically stacked NAND structures with a large number of cells arranged in blocks.

With reference to FIG. 1, which is a cross-section view of an electronic device 10 (e.g. a memory device) according to the prior art. Before word line formation, the substrate is a layered nitride/oxide stack 15 having a thickness T. A memory string is formed in a gap or slit 20 that passes vertically through the layered oxide 4 and nitride 6 (ON) stack 15. As the number of ON pairs and tiers increases to achieve high capacity, the aspect ratio of the feature 20 (e.g. memory holes, or slits) increases greatly (>20). As a result, etching of these structures is increasingly challenging. Bow critical dimension (CD) 22 and delta critical dimension (CD) is out of design specification, so the device does not work according to design rules.

Embodiments of the disclosure advantageously provide deposition methods for forming a protection layer during etch processes methods which allows critical profile control on the sidewall and bottom film, greatly reducing the bow critical dimension (CD) during the etch process. Without being bound by theory, it is thought that the highly selective sidewall liner of one or more embodiments is deposited to protect the sidewall of the semiconductor feature so that the bow CD is greatly reduced compared to a semiconductor feature without any liner. Additionally, substantially no, or a very thin, film profile, at the feature bottom makes it easy to breakthrough for etching.

Figure 2:
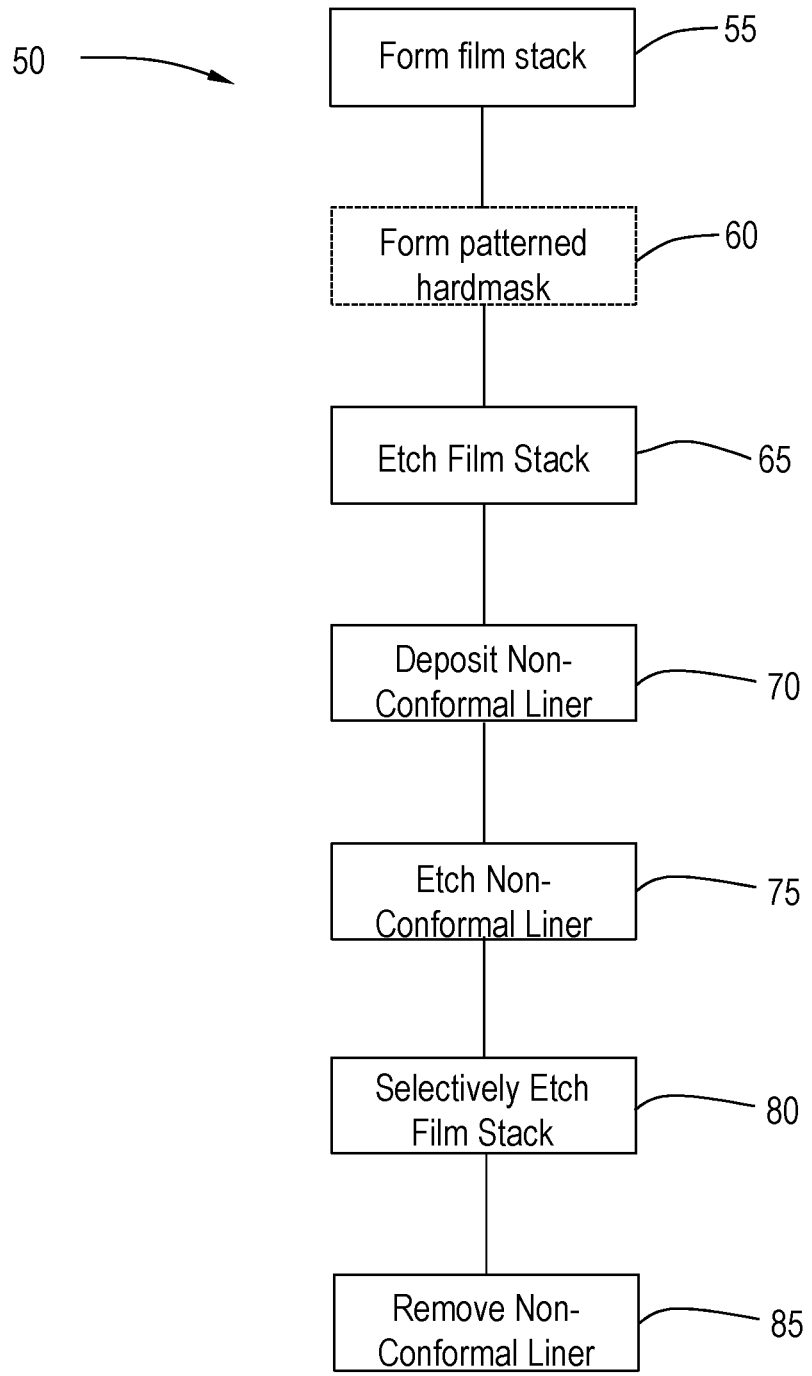
FIG. 2 is a flow chart of a method of forming an electronic device according to one or more embodiments of the disclosure.

Referring to FIGS. 2-9, some embodiments of the disclosure relate to methods for forming electronic devices, memory devices, for example. With reference to FIG. 2, which is a process flow diagram, the method 50 of forming an electronic device begins at operation 55 by forming a film stack. At operation 60, optionally, a patterned hard mask is formed on the film stack. At operation 65, the film stack is etched. At operation 70, a non-conformal liner is deposited. At operation 75, the non-conformal liner is etched. At operation 80, the film stack is selectively etched. At operation 85, the non-conformal liner is removed.

Figure 3:
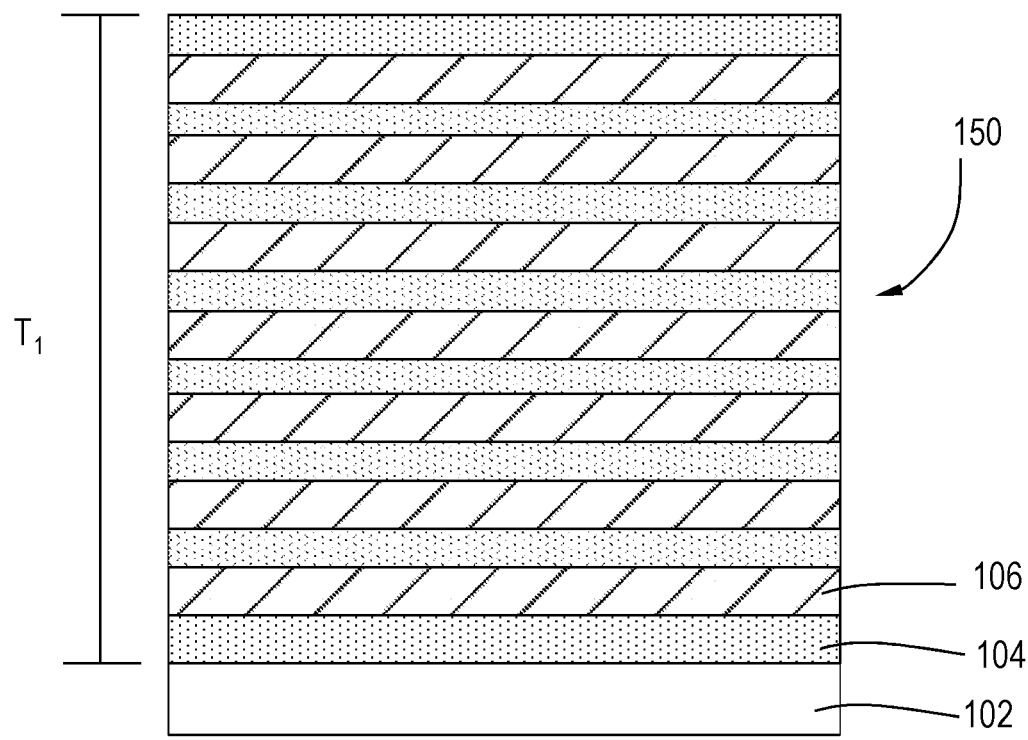
FIG. 3 illustrates an exemplary electronic device according to one or more embodiments of the disclosure.

FIG. 3 illustrates a cross-sectional view of an exemplary device 100 according to some embodiments of this disclosure. In one or more embodiments, a film stack 150 comprises a plurality of alternating layers of a nitride material 104 and an oxide material 106 deposited on the substrate 102.

In one or more embodiments, the film stack 150 has a stack thickness, $T_1$. In some embodiments, the stack thickness, $T_1$, is in a range of about 500 Å to about 3000 Å, including, but not limited to, about 600 Å, about 750 Å, about 900 Å, about 1000 Å, about 1250 Å, about 1500 Å, about 1750 Å, about 2000 Å, about 2250 Å, about 2500 Å, about 2750 Å, or about 2900 Å.

The semiconductor substrate 102 can be any suitable substrate material. In one or more embodiments, the semiconductor substrate 102 comprises a semiconductor material, e.g., silicon (Si), carbon (C), germanium (Ge), silicon germanium (SiGe), gallium arsenide (GaAs), indium phosphate (InP), indium gallium arsenide (InGaAs), indium aluminum arsenide (InAlAs), germanium (Ge), silicon germanium (SiGe), copper indium gallium selenide (CIGS), other semiconductor materials, or any combination thereof. In one or more embodiments, the semiconductor substrate 102 comprises one or more of silicon (Si), germanium (Ge), gallium (Ga), arsenic (As), indium (In), phosphorus (P), copper (Cu), or selenium (Se). Although a few examples of materials from which the substrate 102 may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

Figure 4:
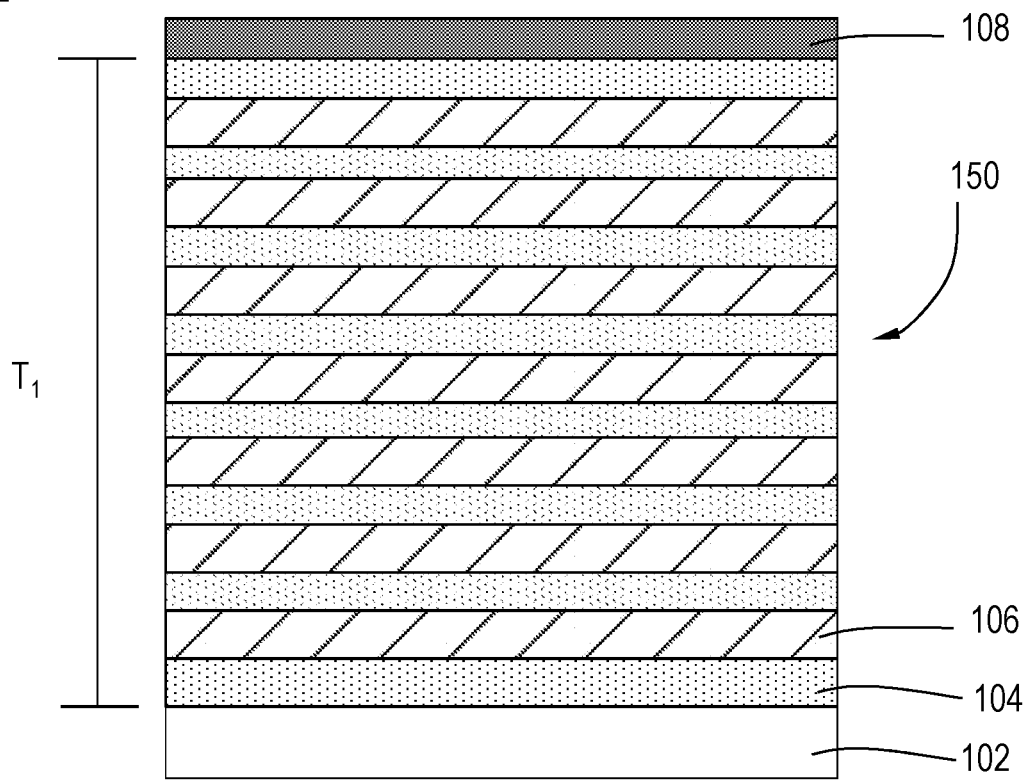
FIG. 4 illustrates an exemplary electronic device according to one or more embodiments of the disclosure.

FIG. 4 illustrates a cross-sectional view of an exemplary device 100 according to some embodiments of this disclosure. With reference to FIG. 4, in one or more embodiments a patterned hard mask 108 is formed on the top surface of the film stack 150. In one or more embodiments, the patterned hard mask 108 may be formed by any suitable process. In some embodiments, the patterned hard mask 108 is formed as a blanket hard mask and subsequently etched to form a patterned hard mask 108. In some embodiments, the patterned hard mask 108 is deposited as a hard mask with a pattern (e.g., patterned printing).

Figure 5A:
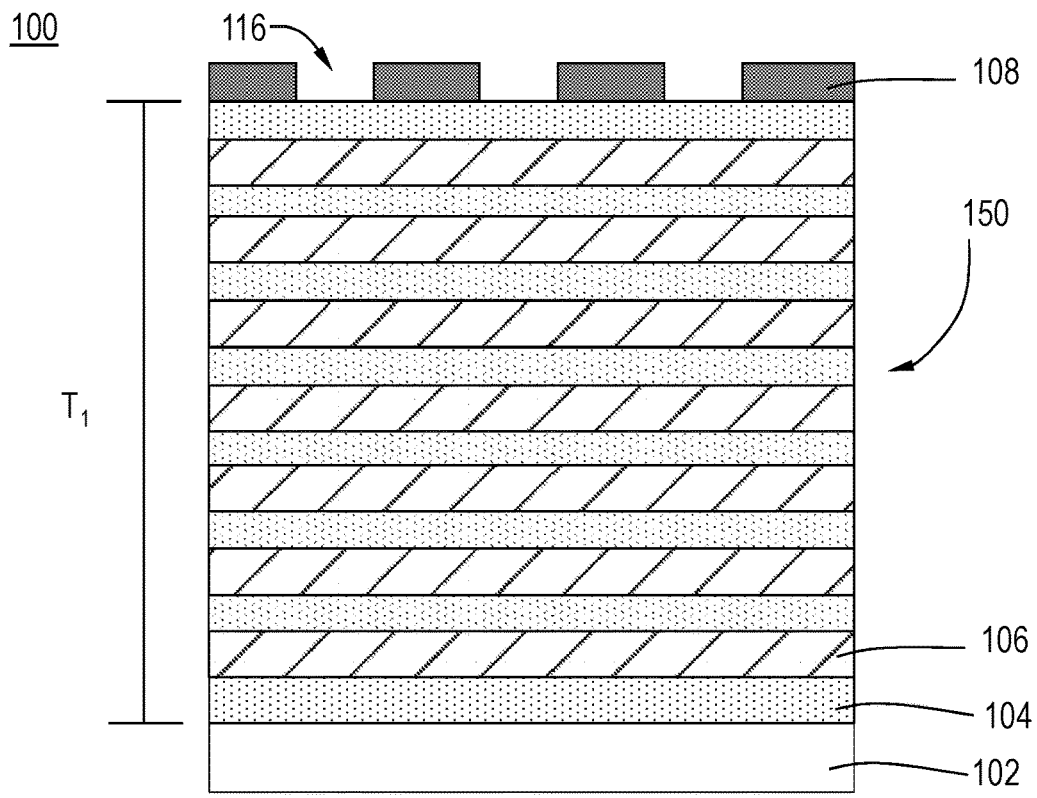
FIG. 5A illustrates an exemplary electronic device according to one or more embodiments of the disclosure.

Referring to FIG. 5A, in one or more embodiments, the patterned hard mask 108 has openings 116 which expose portions of the film stack 150 to allow the film stack 150 to be etched. With reference to FIG. 5A, in one or more embodiments, the openings 116 are first formed in the patterned hard mask 108, exposing a surface of the film stack 150. In some embodiments, the openings 116 have a width in a range of about 1 nm to about 100 nm, about 2 nm to about 80 nm, about 3 nm to about 75 nm, about 4 nm to about 50 nm, or about 5 nm to about 50 nm.

Figure 5B:
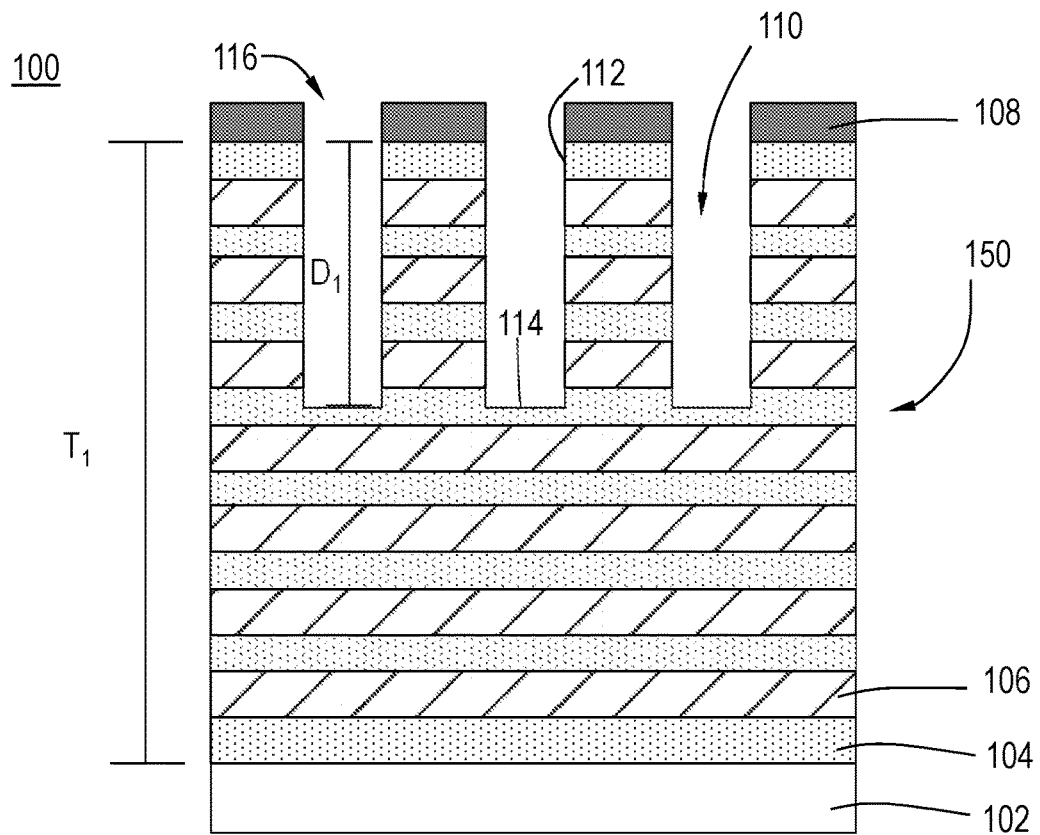
FIG. 5B illustrates an exemplary electronic device according to one or more embodiments of the disclosure.

With reference to FIG. 5B, in one or more embodiments, the film stack 150 is etched to a depth of a first depth, $D_1$, to form an opening 110 with at least one sidewall 112 and a bottom surface 114, the first depth, $D_1$, being less than the stack thickness, $T_1$. In one or more embodiments, the etch process is substantially directional.

As used herein, an etch process which is "substantially directional" refers to a process which removes quantities of a material in one direction over another direction (e.g., removes a vertical trench from a film stack, without etching the sidewalls of the trench). A process which is substantially directional preferentially removes material in a first direction at a rate that is 10, 20, 50 or 100 times faster than material removed in a second direction orthogonal to the first.

In one or more embodiments, the film stack 150 is etched to a depth of a first depth, $D_1$. The first depth, $D_1$, is less than the stack thickness, $T_1$. Stated differently, the etch process does not etch the entire film stack 150. The etch process forms an opening 110. The opening 110 has at least one sidewall 112 and a bottom surface 114. In one or more embodiments, the first depth, $D_1$, is in a range of about 0.5 μM to about 10 μM, or about 1 μm to about 10 μM, including, but not limited to, about 1 μM, about 2 μM, about 3 μM, about 4 μM, about 5 μM, about 6 μM, about 7 μM, about 8 μM, about 9 μM, or about 10 μM.

Figure 6:
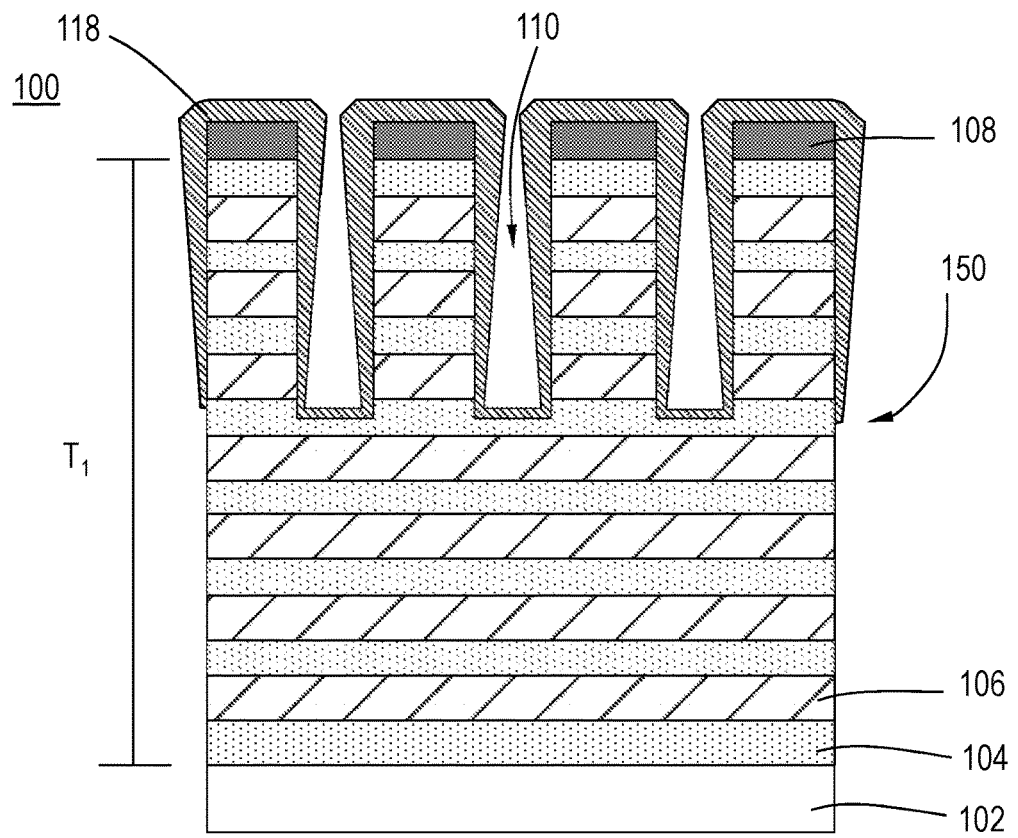
FIG. 6 illustrates an exemplary electronic device according to one or more embodiments of the disclosure.

With reference to FIG. 6, a non-conformal liner 118 is deposited on the at least one sidewall 112 and the bottom surface 114 of the opening 110. In some embodiments, the non-conformal liner 118 comprises boron (B). In some embodiments, the non-conformal liner 118 further comprises nitrogen (N) or carbon (C). In other embodiments, the non-conformal liner 118 comprises one or more of boron (B), carbon (C), or nitrogen (N). In some embodiments, the non-conformal liner 118 comprises one or more of boron, boron nitride (BN), boron carbide (BC), or boron carbonitride (BCN).

In one or more embodiments, the non-conformal liner 118 is substantially free of oxygen. In one or more embodiments, the non-conformal liner 118 is substantially free of silicon. As used herein, the term "substantially free" means that there is less than 5%, including less than 4%, less than 3%, less than 2%, less than 1%, and less than 0.5% of oxygen or silicon present in the non-conformal liner 118. Without intending to be bound by theory, it is thought that non-conformal liners that are substantially free of silicon and/or substantially free of oxygen have greater stability than non-conformal liners which contain silicon and/or nitrogen. For example, in one or more embodiments, a non-conformal liner comprising one or more of boron, carbon, or nitrogen and substantially free of silicon and oxygen has an atomic stability that is greater than a non-conformal liner which comprises silicon and oxygen.

In one or more embodiments, the non-conformal liner 118 may be deposited by any suitable process. In some embodiments, the non-conformal liner 118 is deposited by chemical vapor deposition (CVD).

Chemical vapor deposition (CVD) is a process employed for depositing layers on a substrate. CVD is a flux-dependent deposition technique that requires precise control of the substrate temperature and the precursors introduced into the processing chamber in order to produce a desired layer of uniform thickness.

In one or more embodiments, the non-conformal liner 118 is formed by exposing the substrate 102 to a boron-containing precursor and a reactant. In one or more embodiments, the boron-containing precursor is any boron-containing precursor known to one of skill in the art.

In one or more embodiments, the boron-containing precursor has the general formula $B_xC_yN_zH_v$, wherein x is from greater than 0 to less than 1, y is from 0 to less than 1, z is from 0 to less than 1, and v is from 0 to less than 1. In some embodiments, the boron-containing precursor is obtained from the reaction of a boron (B) source, such as, but not limited to, $(BR_1R_2R_3)_m$, wherein $R_1$, $R_2$, and $R_3$ are independently selected from hydrogen (H), methyl ($CH_3$), ethyl ($C_2H_5$), propyl ($C_3H_7$), $C_nH_{2n+2}$, $C_nH_{2n}^2{}_{-2}$, or $C_nH_{2n}$, m is less than 8, and n is less than 8. In one or more embodiments, the boron source is selected from one or more of borane ($BH_3$), diborane ($B_2H_6$), triborane ($B_3H_5$), tetraborane ($B_4H_{10}$), pentaborane9 ($B_5H_9$), pentaborane11 ($B_5H_{11}$), alkylboranes, including, but not limited to, tetramethyldiborane (($CH_3$)$_2$BH), methyldiborane ($CH_3B_2H_5$), or the like.

In one or more embodiments, a hydrocarbon-based carbon source gas is selected from one or more of $C_aH_{2a+2}$, $C_bH_{2b}$, $C_bH_{2b-2}$, wherein a is a number of 1 or more and b is a number of 2 or more. In one or more embodiments, the hydrocarbon-based carbon source gas is selected from one or more of benzene ($C_6H_6$), methane ($CH_4$), ethane ($C_2H_6$), propane ($C_3H_8$), butane ($C_4H_{10}$), isobutane ($C_4H_{10}$), pentane ($C_5H_{12}$), isopentane ($C_5H_{12}$), neopentane ($C_5H_{12}$), ethylene ($C_2H_4$), propylene ($C_3H_6$), isopropylene ($C_3H_6$), butylene ($C_4H_8$), isobutylene ($C_4H_8$), pentene ($C_5H_{10}$), isopentene ($C_6H_{10}$), neopentene ($C_6H_{10}$), acetylene ($C_2H_2$), propyne ($C_3H_4$), isopropyne ($C_3H_4$), butadiene ($C_4H_6$), isobutadiene ($C_4H_6$), isoprene ($C_5H_8$), and the like.

In one or more embodiments, the nitrogen source gas is selected from one or more of ammonia ($NH_3$), $R_1NH_2$, $R_1R_2NH$, or $R_1R_2R_3N$, wherein $R_1$, $R_2$, and $R_3$ are independently selected from hydrogen (H), methyl ($CH_3$), ethyl ($C_2H_5$), propyl ($C_3H_7$), $C_nH_{2n+}2$, $C_nH_{2n}^2{}_{-2}$, or $C_nN_{2n}$, n is less than 8.

In one or more embodiments, the boron-containing precursor has the general formula $(R_1R_2R^3)NB(R_1R_2R_3)$, wherein $R_1$, $R_2$, $R_3$ are independently selected from methyl, ethyl, n-propyl, isopropyl, n-butyl, isobutyl, t-butyl, n-pentyl, isopentyl, t-pentyl, n-hexyl, isoheptyl, t-helptyl, n-octyl, isooctyl, t-octyl, isooctyl, t-octyl, benzyl, phenyl, or the like.

In one or more embodiments, the boron-containing precursor is selected from an alkylamine borane. Without intending to be bound by theory, it is thought that the particular selection of the boron-containing precursor enables tuning of the conformality of the liner 118.

In some embodiments, the non-conformal liner 118 is continuous. In some embodiments, the non-conformal liner 118 is thicker on the at least one sidewall 112 of the opening 110 than the bottom surface 114 of the opening 110. In some embodiments, the thickness on the at least one sidewall 112 of the opening 110 is greater than or equal to about 100 percent, greater than or equal to about 110 percent, greater than or equal to about 120 percent, greater than or equal to about 125 percent, greater than or equal to about 150 percent, or greater than or equal to about 200 percent of the thickness of the non-conformal liner 118 on the bottom surface 114 of the opening 110. In some embodiments, the non-conformal liner 118 has a thickness on one sidewall in a range of about 1 nm to about 50 nm. In some embodiments, the non-conformal liner 118 has a thickness on opposite sidewalls 112 of the opening 110 which comprises less than or equal to about 50%, less than or equal to about 30%, less than or equal to about 25%, less than or equal to about 20%, or less than or equal to about 10% of the total width of the opening.

In one or more embodiments, the amount of non-conformal liner on the bottom surface of the opening 110 has a thickness less than a thickness of the non-conformal liner on the at least one sidewall of the opening 110. As used herein, "substantially no" or a "very thin" film profile refers to the amount of non-conformal liner deposited on the bottom surface of the feature. Thus, in one or more embodiments, the amount of non-conformal liner deposited on the bottom surface of the feature is about 90%, 95%, 98%, 99% or 99.5% less than the amount of non-conformal liner deposited on at least one side of the opening 110.

As used herein, a liner which is non-conformal refers to a liner where the thickness is different throughout (e.g., on the top, middle and bottom of sidewalls and on the bottom surface of the opening 110). A liner which is non-conformal varies in thickness by greater than or equal to about 11%, or about 15%, or about 20%, or about 30%, or about 40%, or about 50%, or more.

Figure 7:
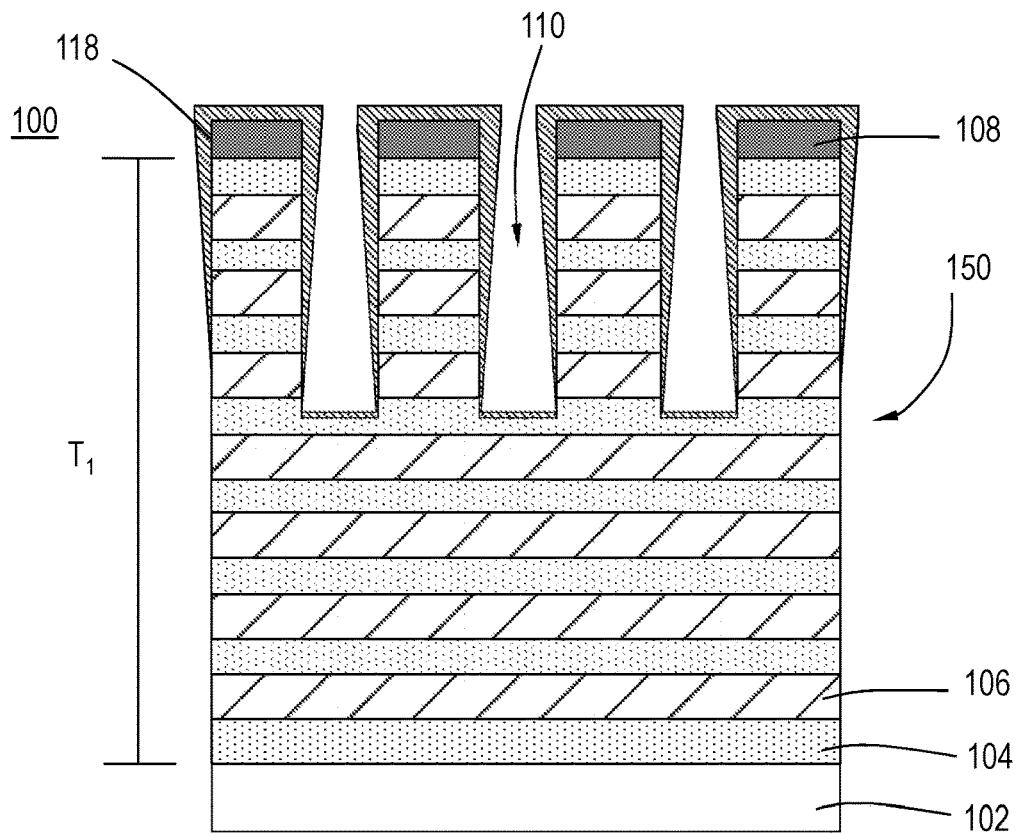
FIG. 7 illustrates an exemplary electronic device according to one or more embodiments of the disclosure.

With reference to FIG. 7, the non-conformal liner 118 is etched from the bottom surface 114 of the opening 110 to expose the film stack 150. In one or more embodiments, such etching from the bottom surface 114 may be referred to as a "bottom punch." In one or more embodiments, the etching may be performed by any etch process known to the skilled artisan. In some embodiments, the etching comprises a reactive ion etch (RIE). In one or more embodiments, referring to FIG. 7, when the non-conformal liner 118 is etched from the bottom surface 114 of the opening 110, substantially all of the non-conformal liner 118 is removed from the bottom surface 114 of the opening 110 exposing the film stack 150 on the bottom surface 114 of the opening 110, while a portion of the non-conformal liner 118 remains on at least one sidewall 112 of the opening 110. In some embodiments, less than about 50% of the non-conformal liner 118 remains on at least one side wall 112 of the opening 110, including less than about 40%, less than about 30%, less than about 20%, or less than about 10%. In one or more embodiments, when the non-conformal liner 118 is etched from the bottom surface 114 of the opening 110, some of the non-conformal liner 118 may remain on the bottom surface 114. In other embodiments, not illustrated, the non-conformal liner is completely removed from the bottom surface 114 of the opening 110.

Figure 8:
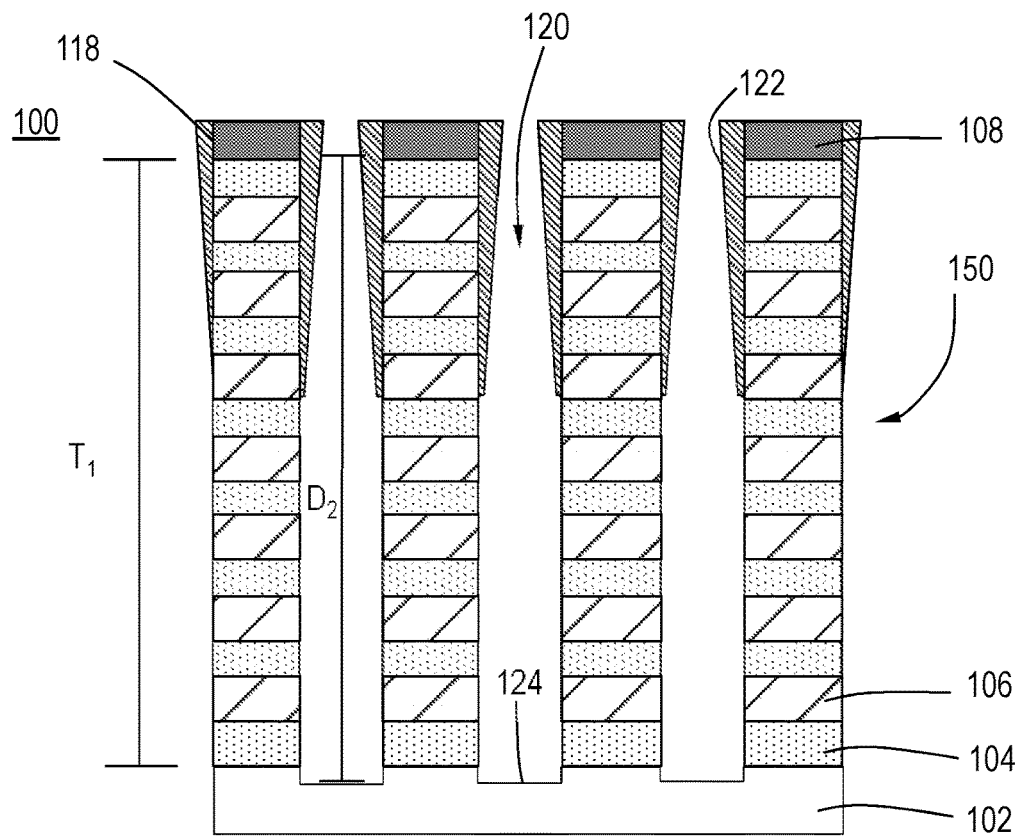
FIG. 8 illustrates an exemplary electronic device according to one or more embodiments of the disclosure.

Referring to FIG. 8, the film stack 150 is selectively etched relative to the non-conformal liner 118 to a depth of a second depth, $D_2$, to form a hole 120. Etching the film stack 150 extends the total depth of the opening 110 to form a hole 120 having at least one side wall 122 and hole bottom surface 124. In one or more embodiments, the hole 120 extends through the length of the film stack 150 into the substrate 102. In other embodiments, the sum of first depth, $D_1$, and the second depth, $D_2$, is less than the stack thickness, $T_1$. Thus, in one or more embodiments, the etch process, as illustrated in FIG. 8, does not etch the entire film stack 150 to the substrate 102.

In one or more embodiments, the second depth, $D_2$, has a range of about 0.5 µM to about 10 µM, including, but not limited to, about 1 µM, about 2 µM, about 3 µM, about 4 µM, about 5 µM, about 6 µM, about 7 µM, about 8 µM, about 9 µM, or about 10 µM.

In one or more embodiments, portions of the non-conformal liner 118 are removed from the at least one sidewall 112 of the opening 110 during etching to form the hole 120. In one or more embodiments, the hole 120 comprises a memory hole or a word line slit. In such embodiments where the hole 120 comprises a memory hole or a word line slit, the electronic device 100 comprises a memory device or a logic device, e.g. NAND, VNAND, DRAM, or the like.

As used herein, the term "3D NAND" refers to a type of electronic (solid-state) non-volatile computer storage memory in which the memory cells are stacked in multiple layers. 3D NAND memory generally includes a plurality of memory cells that include floating-gate transistors. Traditionally, 3D NAND memory cells include a plurality of NAND memory structures arranged in three dimensions around a bit line.

As used herein, the term "dynamic random access memory" or "DRAM" refers to a memory cell that stores a datum bit by storing a packet of charge (i.e., a binary one), or no charge (i.e., a binary zero) on a capacitor. The charge is gated onto the capacitor via an access transistor, and sensed by turning on the same transistor and looking at the voltage perturbation created by dumping the charge packet on the interconnect line on the transistor output. Thus, a single DRAM cell is made of one transistor and one capacitor.

As used herein, the phrase "selectively etched", or similar, means that the subject materials are etched to a greater extent than other materials. In some embodiments, "selectively" means that the subject material is removed at a rate greater than or equal to about 10×, 15×, 20×, 25×, 30×, 35×, 40×, 45× or 50× the rate of removal from the non-selected surface. Without being bound by theory, it is believed that the non-conformal liner 118 protects the sidewall 112 of the opening 110 during etching, enabling the selective etching of the film stack 150.

Figure 9:
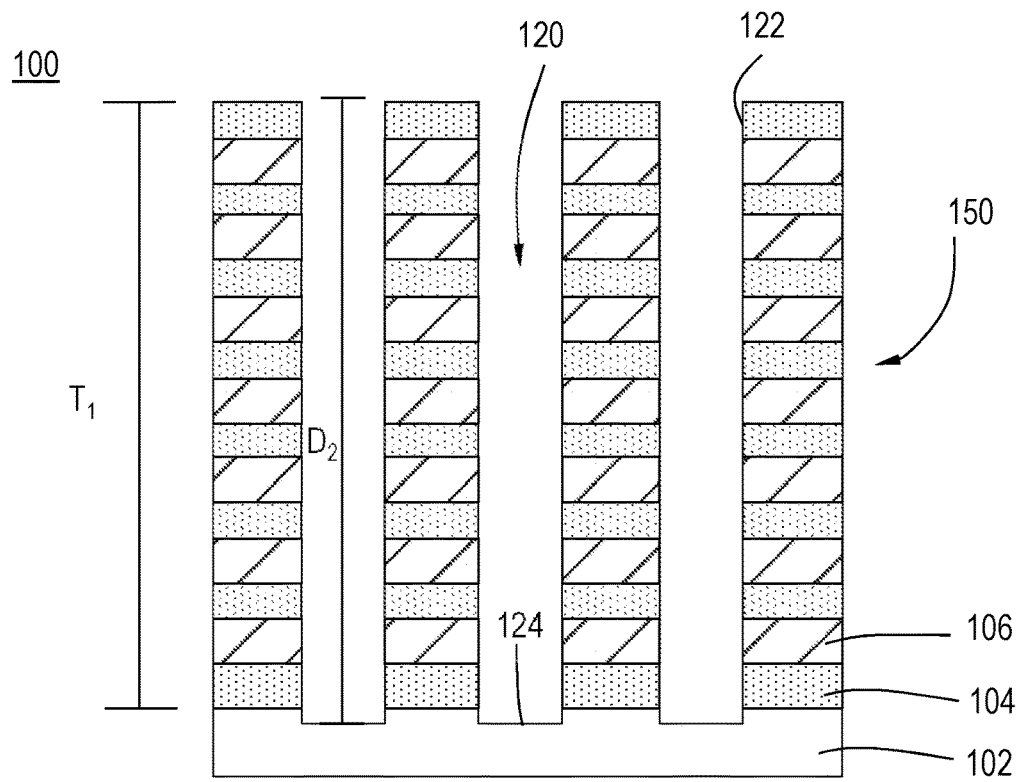
FIG. 9 illustrates an exemplary electronic device according to one or more embodiments of the disclosure.

In one or more embodiments, as illustrated in FIG. 9, the non-conformal liner 118 is removed, or stripped, from the at least one sidewall 112. As illustrated in FIG. 9, in one or more embodiments, when the non-conformal liner 118 is removed, the patterned hard mask 108 is also removed. In some embodiments, the non-conformal liner 118 is removed by a process comprising an anneal in an oxidizing atmosphere. In some embodiments, the oxidizing atmosphere comprises one or more of $O_2$, $O_3$, $H_2O$, $H_2O_2$, CO, $CO_2$, $N_2O$, $NO_2$ or NO. In some embodiments, the anneal is performed at a temperature greater than or equal to about 450° C., greater than or equal to about 500° C., greater than or equal to about 600° C., greater than or equal to about 750° C., greater than or equal to about 1000° C., greater than or equal to about 1100° C., or greater than or equal to about 1200° C. In some embodiments, the non-conformal liner 118 is removed by a process comprising an oxygen plasma ash. In some embodiments, the oxygen plasma ash is performed at a temperature in a range of about 300° C. to about 400° C.

Without being bound by theory, it is believed that for non-conformal liners comprising boron, the boron can be removed by the steam anneal process. Further, for liners comprising carbon, the carbon can be removed by the oxygen plasma ash process.

In one or more embodiments, the non-conformal liner 118 can be used during any high aspect ratio (AR) etch process where critical dimension blowout is a concern. As the aspect ratio of a memory or word line slit on an electronic device increases (e.g. aspect ratio >20), etch processes can run into problems with bow and delta critical dimension (CD) reduction. In one or more embodiments, the highly selective non-conformal liner 118 protects the at least one sidewall 112, 122 of the feature so that the bow CD is greatly reduced, compared to a feature without any liner. Substantially no, or very thin film profile, at the feature bottom 114 makes it easier to breakthrough for the second etch, as illustrated in FIG. 8.

Deposition chambers that may implement one or more embodiments of the disclosure may include chemical vapor deposition (CVD) chambers, high-density plasma chemical vapor deposition (HDP-CVD) chambers, plasma enhanced chemical vapor deposition (PECVD) chambers, sub-atmospheric chemical vapor deposition (SACVD) chambers, and thermal chemical vapor deposition chambers, among other types of chambers. Specific examples of CVD systems that may implement embodiments of the invention include the CENTURA ULTIMA® HDP-CVD chambers/systems, and PRODUCER® PECVD chambers/systems, available from Applied Materials, Inc. of Santa Clara, Calif.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method comprising:
    forming a film stack on a substrate, the film stack comprising a plurality of alternating layers of an oxide material and a nitride material and the film stack having a stack thickness;
    etching the film stack to a first depth to form an opening with at least one sidewall and a bottom, the first depth being less than the thickness;
    depositing a non-conformal liner on the at least one sidewall and the bottom of the opening, the non-conformal liner on the bottom of the opening having a thickness less than a thickness of the non-conformal liner on the at least one sidewall of the opening;

etching the non-conformal liner from the bottom of the opening to reduce the thickness of the non-conformal liner on the bottom of the opening;

selectively etching the film stack relative to the non-conformal liner to a second depth to form a hole; and annealing the film stack in an oxidizing atmosphere to remove the non-conformal liner.

2. The method of claim 1, wherein the stack thickness is in a range of about 1 µM to about 10 µM.

3. The method of claim 1, further comprising forming a patterned hard mask on the film stack before etching.

4. The method of claim 3, wherein openings in the patterned hard mask expose portions of the film stack to be etched.

5. The method of claim 4, wherein the openings in the patterned hard mask have a width in a range of about 1 nm to about 3000 nm.

6. The method of claim 1, wherein the non-conformal liner comprises one or more of boron, carbon, or nitrogen.

7. The method of claim 1, wherein the non-conformal liner is deposited by chemical vapor deposition.

8. The method of claim 1, wherein the non-conformal liner is formed by exposing the substrate to a boron-containing precursor and a reactant.

9. The method of claim 1, wherein the hole comprises one or more of a memory hole or a word line slit.

10. The method of claim 1, wherein the second depth is in a range of about 1 µM to about 10 µM.

11. The method of claim 1, wherein the hole has a reduced bow critical dimension of about 50 nm.

12. The method of claim 1, wherein the non-conformal liner has a thickness in a range of about 1 nm to about 50 nm.

13. The method of claim 1, wherein annealing is performed at a temperature greater than or equal to about 500° C.

14. A method comprising:

forming a film stack on a substrate, the film stack comprising a plurality of alternating layers of an oxide material and a nitride material and the film stack having a stack thickness;

forming a patterned hard mask on the film stack;

etching the film stack through the hard mask to a first depth to form an opening with at least one sidewall and a bottom surface, the first depth being less than the stack thickness;

depositing a non-conformal liner by atomic layer deposition on the at least one sidewall and the bottom surface of the opening, the non-conformal liner on the bottom surface of the opening having a thickness less than a thickness of the non-conformal liner on the at least one sidewall of the opening, the non-conformal liner comprising one or more of boron, nitrogen, or carbon;

etching the non-conformal liner from the bottom surface of the opening to reduce the thickness of the non-conformal liner on the bottom surface of the opening;

selectively etching the film stack relative to the non-conformal liner to a second depth to form a hole; and performing an anneal of the substrate to remove the non-conformal liner, wherein the anneal is performed in an oxidizing atmosphere.

15. The method of claim 14, wherein the non-conformal liner is formed by exposing the substrate to a boron-containing precursor and a reactant.

16. The method of claim 15, wherein the non-conformal liner has a thickness in a range of about 1 nm to about 50 nm.

17. The method of claim 14, wherein the anneal is performed at a temperature greater than or equal to about 400° C.

18. The method of claim 14, wherein the non-conformal liner is completely removed from the bottom surface of the opening.

19. An electronic device comprising:

a film stack on a substrate, the film stack comprising a plurality of alternating layers of an oxide material and a nitride material and the film stack having a stack thickness;

a patterned hard mask on the film stack;

an opening of a first depth formed in the film stack, the opening having at least one sidewall and a bottom, the first depth being less than the first thickness; and a non-conformal liner formed on the at least one sidewall and the bottom surface of the opening, the non-conformal liner on the bottom surface of the opening having a thickness less than a thickness of the non-conformal liner on the at least one sidewall of the opening, and the non-conformal liner comprising boron carbide (BC).

20. The method of claim 1, wherein the non-conformal liner is completely removed from the bottom of the opening.

* * * * *